(12) United States Patent
Hsieh et al.

(10) Patent No.: US 9,776,852 B2
(45) Date of Patent: Oct. 3, 2017

(54) METHOD FOR CONTROLLING SURFACE ROUGHNESS IN MEMS STRUCTURE

(71) Applicant: TAIWAN SEMICONDUCTOR MANUFACTURING COMPANY LTD., Hsinchu (TW)

(72) Inventors: Yuan-Chih Hsieh, Hsinchu (TW); Lee-Chuan Tseng, New Taipei (TW); Hung-Hua Lin, Taipei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 15/012,311

(22) Filed: Feb. 1, 2016

(65) Prior Publication Data

US 2017/0217756 A1    Aug. 3, 2017

(51) Int. Cl.
*B81B 3/00* (2006.01)
*B81C 1/00* (2006.01)

(52) U.S. Cl.
CPC ........ *B81B 3/0005* (2013.01); *B81C 1/00984* (2013.01); *B81B 2207/09* (2013.01); *B81C 2201/115* (2013.01)

(58) Field of Classification Search
CPC .............. B81B 3/0005; B81B 2207/09; B81C 1/00984; B81C 2201/115
USPC ................................ 257/252; 438/48, 51, 54
See application file for complete search history.

(56) References Cited

U.S. PATENT DOCUMENTS

| | | | | |
|---|---|---|---|---|
| 2005/0161749 A1* | 7/2005 | Yang | ..................... | B81B 3/0035 257/414 |
| 2006/0053878 A1* | 3/2006 | Ikeda | .................... | G01F 1/6845 73/204.26 |
| 2006/0148121 A1* | 7/2006 | Yang | .................. | G02B 26/0841 438/66 |
| 2010/0213576 A1* | 8/2010 | Hiranaka | ............... | B82Y 20/00 257/615 |
| 2010/0301703 A1* | 12/2010 | Chen | .................. | H03H 9/02007 310/318 |
| 2011/0014776 A1* | 1/2011 | Akiyama | .......... | H01L 21/76254 438/458 |
| 2013/0181355 A1* | 7/2013 | Tsai | ..................... | B81C 1/0023 257/774 |
| 2016/0039668 A1* | 2/2016 | Zhang | .................. | B81C 1/0023 257/417 |

* cited by examiner

*Primary Examiner* — John C Ingham
*Assistant Examiner* — Didarul Mazumder
(74) *Attorney, Agent, or Firm* — WPAT, P.C., Intellectual Property Attorneys; Anthony King

(57) ABSTRACT

The present disclosure provides a method for manufacturing a CMOS-MEMS structure. The method includes etching a cavity on a first surface of a cap substrate; bonding the first surface of the cap substrate with a sensing substrate; thinning a second surface of the sensing substrate, the second surface being opposite to a third surface of the sensing substrate bonded to the cap substrate; etching the second surface of the sensing substrate; patterning a portion of the second surface of the sensing substrate to form a plurality of bonding regions; depositing an eutectic metal layer on the plurality of bonding regions; etching a portion of the sensing substrate under the cavity to form a movable element; and bonding the sensing substrate to a CMOS substrate through the eutectic metal layer.

20 Claims, 9 Drawing Sheets

(Optional Step)

METHOD FOR CONTROLLING SURFACE ROUGHNESS IN MEMS STRUCTURE

BACKGROUND

In the MEMS and micro-electronic fields there is frequently a need for bonding wafers together for the purpose of encapsulating structures in vacuum cavities or in cavities with controlled atmosphere. Such structures may have to be operable during very long times, most often tens of years. It can also be desirable to provide electrical connection between wafers via the sealing.

It is of course absolutely necessary that the joints that holds/bonds the wafers together and that provides the actual sealing of said cavities will provide good enough sealing that will not deteriorate over time. Eutectic bonding is one of popular means for bonding, but eutectic bonding may cause large deviations. In addition, eutectic overflow is another issue need to be taken care of.

Another reliability problem commonly observed with MEMS devices is stiction, or the surface tension between approximate surfaces under miniature scale. Generally, stiction is the static friction that needs to be overcome in order to enable relative motion of stationary objects that are in contact with one another. When two surfaces with areas below the micrometer range come into close proximity, such as evidenced in MEMS devices, they may adhere together, thus limiting the reliability of the MEMS device. At this scale, the two main failure factors of MEMS devices are electrostatic or charge-induced stiction, and/or Van der Waals force-induced stiction. Such stiction issues present various problems previously addressed.

Therefore, a novel mechanism to mitigate aforementioned issues has become an urgent need in fields pertinent to semiconductor manufacturing industry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
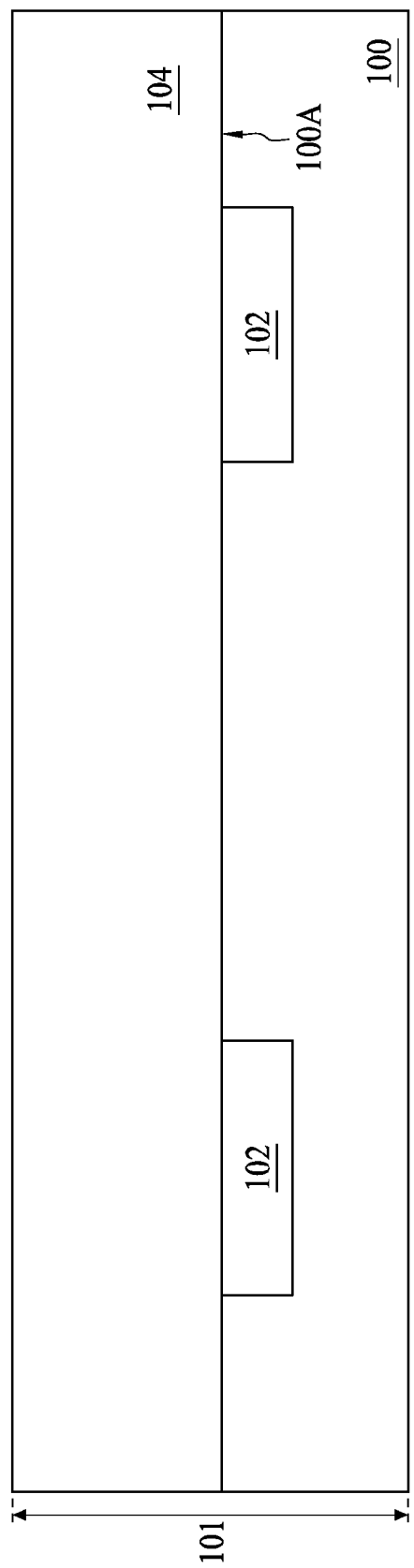
FIGS. 1-9 are a series of cross-sectional views illustrating processing steps to fabricate a CMOS-MEMS structure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure relates generally to Micro-Electro-Mechanical Systems (MEMS) devices. The following description is presented to enable one of ordinary skill in the art to make and use the disclosure and is provided in the context of a patent application and its requirements. Various modifications to the preferred embodiment and the generic principles and features described herein will be readily apparent to those skilled in the art. Thus, the present disclosure is not intended to be limited to the embodiment shown but is to be accorded the widest scope consistent with the principles and features described herein.

In the described embodiments, MEMS refers to a class of structures or devices fabricated using semiconductor-like processes and exhibiting mechanical characteristics such as the ability to move or deform. MEMS often, but not always, interact with electrical signals. MEMS devices include, but are not limited to, gyroscopes, accelerometers, magnetometers, pressure sensors, biosensors, humidity sensors, inertial sensors, and radio-frequency components. In some embodiments, a MEMS device structure may include a plurality of the aforesaid MEMS devices. Silicon wafers containing a MEMS device or a MEMS device structure are referred to as MEMS wafers.

In the described embodiments, MEMS device may refer to a semiconductor device implemented as a micro-electro-mechanical system. A MEMS device structure may refer to any feature associated with an assembly of a plurality of MEMS devices. An engineered silicon-on-insulator (ESOI) wafer may refer to a SOI wafer with cavities beneath the silicon device layer or substrate. Cap or handle wafer typically refers to a thicker substrate used as a carrier for the thinner silicon sensing substrate in a silicon-on-insulator wafer. Cap or handle substrate and cap or handle wafer can be interchanged. In the described embodiments, a cavity may refer to an opening or recession in a substrate wafer and enclosure may refer to a fully enclosed space.

The present disclosure reveals a series of process describing the steps of making a rough surface of a semiconductor surface so as to improve stiction, which can be defined as the static friction that needs to be overcome to enable relative motion of stationary objects in contact. Generally, stiction occurs when two surfaces in close proximity come in contact, unintentionally by external environmental forces. For a MEMS device, stiction is an undesirable situation, it happens when suspension structures within a MEMS device contact and stick together or said suspension structures contact and stick to the "device wall" under certain mechanical shock. Additionally, the damaged or even unrecoverable suspension structures can result in malfunction of the MEMS device. Therefore, it is desirable to provide a MEMS device with a reduced occurrence of stiction. Usually, the stiction force can be controlled by the contact area. That is, the "stiction" phenomenon can be alleviated by reducing the contact area. Therefore, the stiction can be reduced by increasing the roughness of the semiconductor surface. For example, common methods for achieving a rough surface may include depositing a rough polysilicon or amorphous silicon on top of the semiconductor surface.

Usually, the stiction of the MEMS device can be tested by a wafer level centrifugal system, which can apply a continuous acceleration to a tested MEMS device on the wafer. After fixing the tested MEMS device on the wafer, the tested MEMS device will experience a gravitational force, called g-force. The g-force value can be converted from the number of revolutions per time period. A "stuck g-force value" of the tested MEMS device is defined as the value when the suspension structures within a tested MEMS device can no longer separate from each other of the "device wall" after the gravitational force reduced to zero from the high gravitational value. For example, if the suspension structures within the tested MEMS device cannot separate and perform perfectly after bearing certain gravitational force value, such as 2700G (several tests will be performed to obtain its limitation) under a series of centrifugal tests, the "stuck g-force value" of the tested MEMS device is below 2700G.

In view of the above, techniques for precisely controlling the stiction of the MEMS to obtain a greater stuck g-force value are highly desired. In an old conventional method, a required roughness of the semiconductor surface is achieved by depositing a polysilicon or an amorphous polysilicon to roughen the surface of the suspension structure. Two wafers (a sensing substrate and a cap substrate with a plurality of defined and patterned cavities) are fusion bonded together at the first step. Then, a grinding operation is performed to thin down the thickness of the sensing substrate from about 700 μm to about 30 μm. Subsequently, a Chemical Mechanical Planarization (CMP) operation is implemented in order to achieve a roughness of a first surface of the sensing substrate (the surface not contact with the cap substrate) of around 1 Å to 2 Å (nearly mirror-surface). Then, a standoff structure which is composed of a plurality of protrusions is formed on the first surface of the sensing substrate by well-known photolithography operations. A film made of undoped polysilicon is deposited on a top surface of the standoff structure and the first surface of the sensing substrate to achieve a roughness about several hundreds of Angstroms. Normally, a thickness of the undoped polysilicon is about several Angstroms. Subsequently, an annealing operation is implemented to change the undoped film into a doped film by a dopant diffusion process before the formation of eutectic metal. The reason for using undoped film is due to its rougher surface compared to the doped counterpart, and the rougher surface is necessary for obtaining a greater stuck g-force value for the actuator part that includes movable elements, sensing substrate, and bonding regions. Additionally, in some embodiments, the undoped film is turned into the doped film by annealing process for better electrical properties. Alternatively, a doped film may be directly deposited on a top surface of the standoff structure and the first surface of the sensing substrate, and then an optimization process is processed to roughen the surface. It is noted that utilizing two different materials (doped or undoped materials) for the cap substrate and the sensing substrate is doable.

Compared to the conventional techniques, the present disclosure provides a cost-effective solution without requiring an additional undoped film deposition as described above. To describe the features of the disclosure in more detail, apparatus and fabrication methods to achieve a MEMS device with features including improved stiction are disclosed below.

FIGS. 1-9 are a series of cross-sectional views illustrating processing steps to fabricate a MEMS device assembly, or a MEMS device, according to an embodiment of the present disclosure. In FIG. 1, a sensing substrate 104 and a cap substrate 100 are fusion bonded together to form an ESOI substrate 101. Please note that in the exemplary embodiment of the present disclosure, the sensing substrate 104 and the cap substrate 100 are bonded together by fusion bonding at relatively high processing temperatures, which enables more complete removal of chemical species from the dielectric materials in the substrates prior to sealing cavities of the MEMS structures. Fusion bonding makes high temperature annealing on both sides wafers possible, which reduces outgassing of chemical species during the cavity formation operation. The MEMS structures bonded by fusion bonding are mechanically stronger compared to metal bonding due to a higher bonding ratio. In addition, fusion bonding enables the formation of through substrate vias (TSVs) in the MEMS structures without degrading yield. However, the concept of the present disclosure is not limited thereto. One of ordinary skill in the art would recognize many variations, modifications, and alternatives. The concept of the present disclosure may be also applied to other types of MEMS device assembly in some embodiments.

On a first surface 100A of the cap substrate 100, a plurality of cavities 102 of desired sizes are defined and patterned through isotropic etching, for example, but this is not a limitation of the present disclosure. One of ordinary skill in the art would recognize many variations, modifications, and alternatives. The plurality of cavities 102 are utilized to accommodate a proximal movable element (also called as proof mass or suspension structure) of a MEMS device to be fabricated. The size of each cavity 102 may be determined according to the movable element and/or desired performance of the MEMS device. In some embodiments, each cavity 102 may be of different depth or dimension than the other cavities. In some embodiments, each cavity 102 may have different types of shapes.

Figure 2:
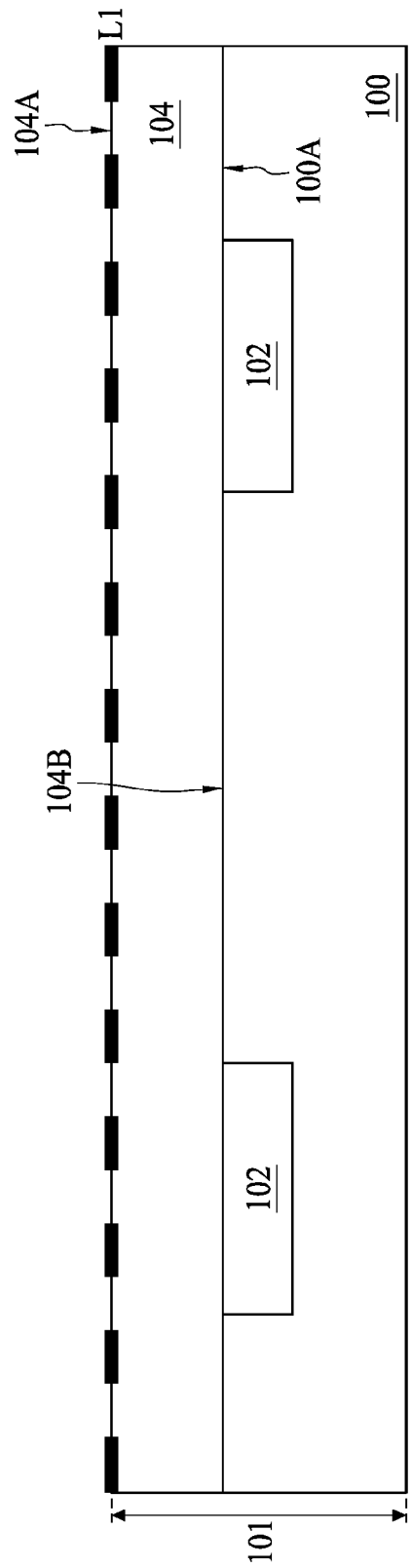

The sensing substrate 104 is then thinned using a grinding and/or other thinning operation to achieve the desired thickness as illustrated in FIG. 2. Suitable grinding and polishing equipments may be used for the thinning operation. One of ordinary skill in the art would recognize many variations, modifications, and alternatives. Precision control of the thinning operation may be utilized in some embodiments since there is no structure that can be used as a stop layer to terminate the thinning operation in the embodiment illustrated in FIG. 2. If not controlled precisely, the thinning may yield a product thinner or thicker than a desired sensing substrate, thus affecting the performance of the MEMS device subsequently fabricated. In some other embodiments, an etch stop layer is integrated into sensing substrate 104 in order to facilitate precision control of the thinning operation. One of ordinary skill in the art would recognize many variations, modifications, and alternatives. In some other embodiments, the thickness of the sensing substrate 104 may be reduced from 700 μm to 30 μm. In some other embodiment, the roughness of the first surface 104A of the sensing substrate 104, opposing to a second surface 104B fusion-bonded to the cap substrate 100, will be about or more than 10000 Å after the grinding operation. The dotted line L1 with wider spaces illustrated in FIG. 2 shows that the first surface 104A is relative rough (for example, more than 10000 Å roughness) after the grinding/thinning operation.

Figure 3:
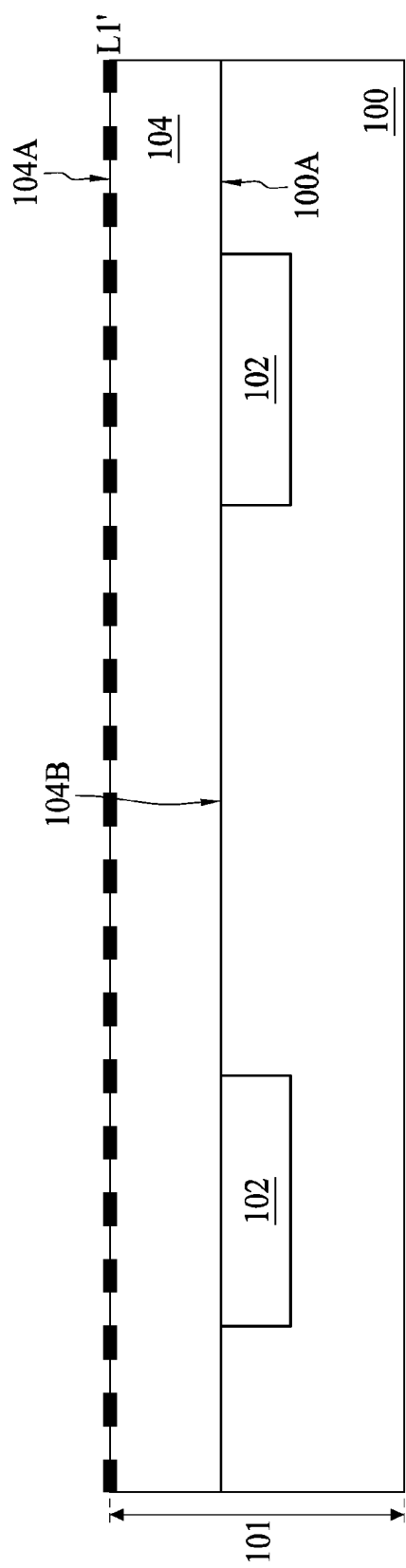

Referring to FIG. 3, the first surface 104A of the sensing substrate 104 is further operated by different types of etching operations, such as a wet etching operation, a dry etching operation, a polishing operation, or combinations thereof. In some embodiments, for a dry etching operation, etching of the substrate can be achieved by using gas such as $XeF_2$ (xenon difluoride) or $SF_6$ (sulfur hexafluoride). In some other embodiments, the etching is accomplished in a reactive ion etching (RIE) or high density plasma (HDP) reactor using an etch chemistry comprising: $CH_2F_2$, $C_4F_8$, $C_2F_6$, Ar, CO, and $CF_4$ at a pressure of between about 1 mTorr and several hundreds of mTorr. In some embodiments, the substrate may be etched using a wet etching operation by utilizing a wet-etchant comprising a base and an oxidant. The appropriate wet etching operation is selectively designed to etch the semiconductor material in order to reduce the roughness of the first surface of the sensing substrate. Additionally, the base may comprise at least one of ammonium hydroxide ($NH_4OH$), tetramethylammonium hydroxide (TMAH), or potassium hydroxide (KOH). The oxidant may comprise at least one of hydrogen peroxide ($H_2O_2$) or ozone ($O_3$). Alternatively, in some embodiments, two types of etching operations may be used that complement each other in their unique characteristics. In some embodiments, the substrate can be made of different types of semiconductor materials. Preferably, a silicon substrate is used but is not limited to. As described above, the roughness of the first surface 104A of the sensing substrate 104 may be further improved by the different types of etching operations. As shown in FIG. 3, the dotted line L1' represents that the first surface 104A of the sensing substrate 104 having a smaller roughness. Normally, after the etching operation, the roughness of the first surface 104A of the sensing substrate 104 can be in a range of about 10 Å to 1000 Å. In other words, compared with the conventional method previously described, the etching operation replaces the conventional Chemical Mechanical Planarization (CMP) operation, right after the grinding operation. In the present disclosure, a surface with a roughness in a range of 10 Å to 1000 Å can be directly obtained after the etching operation. Then, after performing a standard photolithography operation, the standoff structure having a roughness of hundreds of Angstroms can be obtained without growing of an undoped film at the top surface of the previously-formed standoff structure. Additionally, no further annealing operation is required for the undoped film in the present disclosure. That is to say, referring to the conventional techniques previously discussed, the present disclosure provided a cost-effective solution without requiring an additional film deposition. In some exemplary embodiments, thinning the first surface 104A of the sensing substrate 104 may include a further grinding operation.

Figure 4:
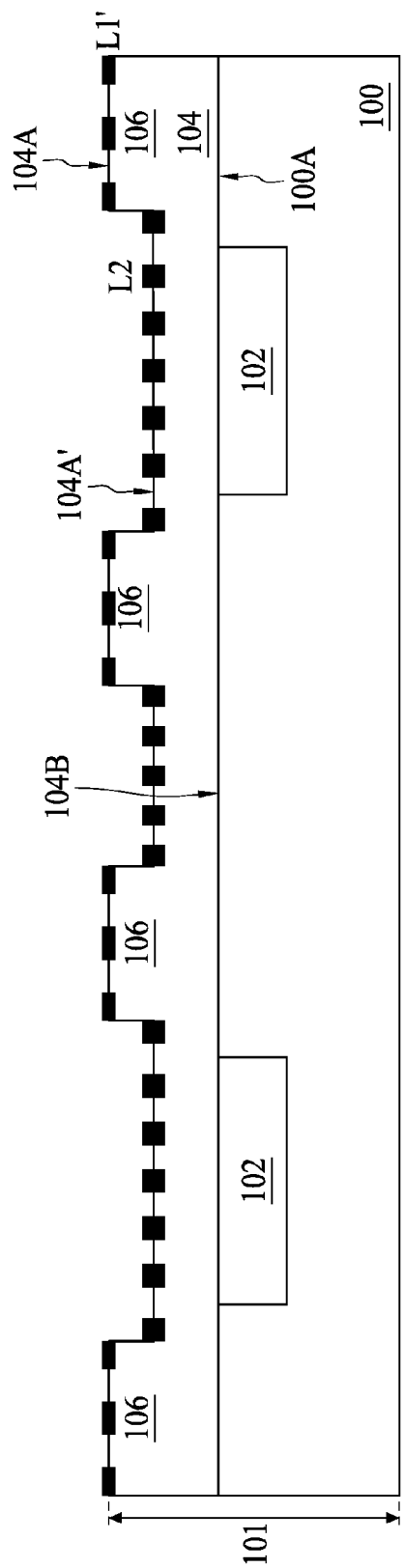

Referring to FIG. 4, a patterned photoresist layer (not shown) is deposited on the sensing substrate 104, followed by a patterning operation to from the plurality of bonding regions 106 (which are also called standoff structures herein) according to some embodiments of the present disclosure. In some embodiments, the sensing substrate 104 and the plurality of bonding regions 106 are composed of undoped semiconductor material, which provides a rougher surface compared with the doped semiconductor material counterpart because the undoped semiconductor material may usually possess a greater grain size than that of the doped semiconductor material counterpart. In some other embodiments, the sensing substrate 104 and the plurality of bonding regions 106 are made of undoped polysilicon. In some exemplary embodiments, the sizes of the bonding regions can vary from 1 μm to 5000 μm depending on the applications or the dimension of the die. One of ordinary skill in the art would recognize many variations, modifications, and alternatives. Again referring to FIG. 4, one of ordinary skill in the art can know the roughness of the recess bottom 104A' of the sensing substrate 104 may be different from the first surface 104A of the sensing substrate 104 after the etching operation. As shown in FIG. 4, the dotted line L2 represents that the recess bottom surface 104A' of the sensing substrate 104 having a different roughness compared to the first surface (mesa top) 104A of the sensing substrate 104.

In some embodiments, the roughness of the recess bottom 104A' of the sensing substrate 104 can be precisely controlled by the etching condition. Additionally, the roughness of the first surface 104A is smaller than 1 nm, and the roughness of the recess bottom 104A' varies from few nanometers to dozed nanometers depending on the quality of the etching recipe.

For purposes of clarity, a photolithography operation in which a photoresist layer is deposited on the sensing substrate 104 and patterned to form an etch mask is not shown in this operation flow. The dimensions of the etch mask may be tightly controlled during photolithography and the etch mask may be formed from any suitable material that is resistant to the etching operation used to etch the sensing substrate. In some embodiments, an etch mask of Silicon Nitride ($Si_3N_4$) is utilized. In some other embodiments, a photoresist layer can serve as the etch mask. One of ordinary skill in the art would recognize many variations, modifications, and alternatives. Although a one dimensional cross section is illustrated in FIG. 4, it will evident to one of skill in the art that a two-dimensional pattern of the desired geometry is formed over the sensing substrate 104.

Figure 5:
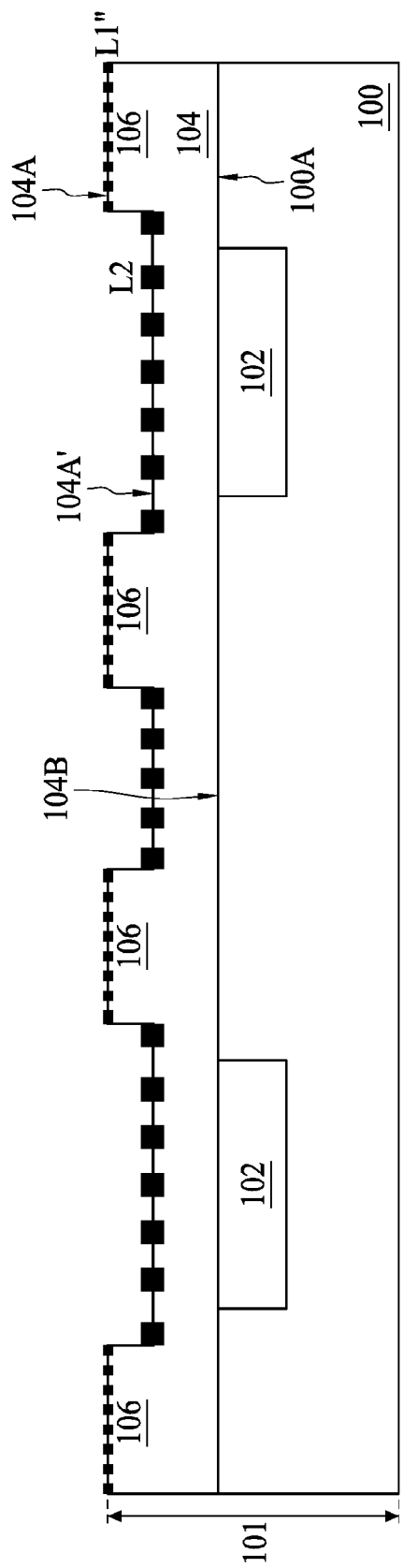

Thereafter, an optional step is shown in FIG. 5, a Chemical Mechanical Planarization (CMP) operation can be performed on the plurality of bonding regions 106. As shown in FIG. 5, the dotted line L1" with narrower spaces compared to L1' represents that the first surface 104A of the sensing substrate 104 has an even smaller roughness after the optional Chemical Mechanical Planarization (CMP) operation. In some embodiments, the CMP operation is determined to conducted when certain patterns needs to be made on the first surface 104A of the sensing substrate 104. In some other embodiments, the CMP operation is determined to conduct for the subsequent photolithography operations.

Figure 6:
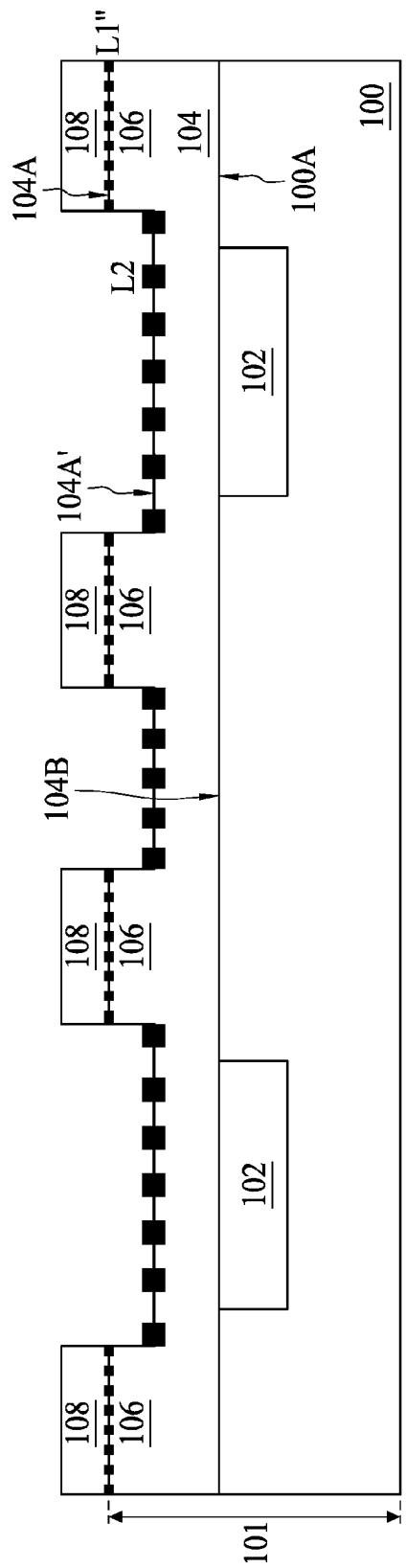

Referring to FIG. 6, an eutectic metal layer 108 is then deposited over the plurality of bonding regions 106. The thickness of the eutectic metal layer 108 defines bonding gaps between the CMOS substrate (shown in FIG. 8) and the sensing substrate 104. In some embodiments, the eutectic metal layer 108 is deposited using electroplating, physical vapor deposition (PVD), or a Chemical Vapor Deposition (CVD) operation. One of ordinary skill in the art would recognize many variations, modifications, and alternatives. In some embodiments, the eutectic metal layer 108 may comprise germanium, aluminum, or copper. In other embodiments, other materials such as gold, indium, or other solders having good adhesion underlying layers and improved wetting capability may be used for the bonding regions.

Figure 7:
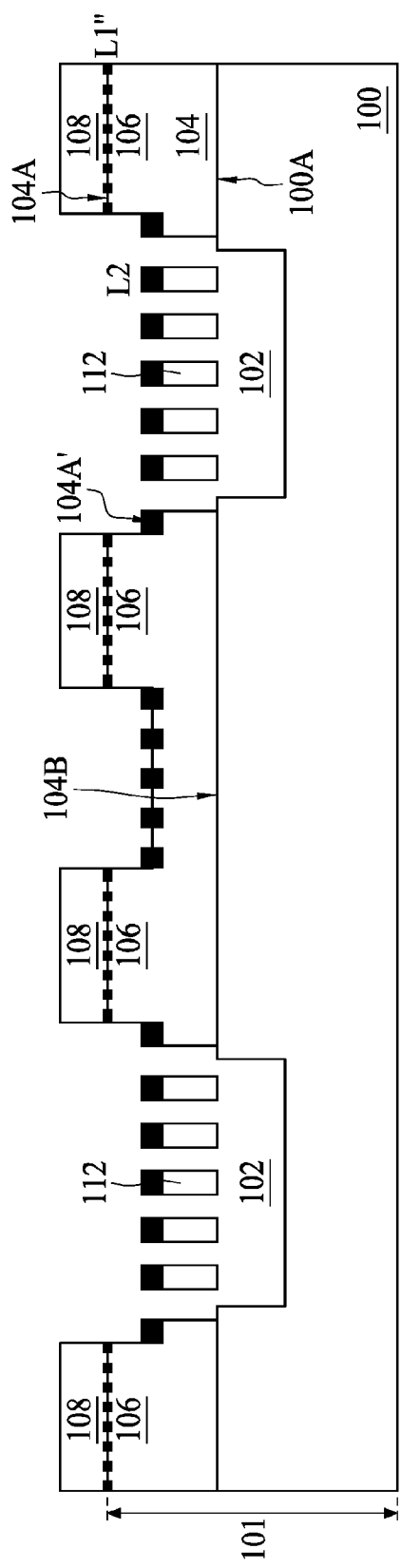

The sensing substrate 104 is then patterned and etched to form the movable element (the proof mass) 112 as illustrated in FIG. 7. The sensing substrate 104 includes the movable element 112, balanced or unbalanced, suspended by at least one spring or elastic device and free to move in at least one of the x-, y-, and z-directions, with at least one electrode embedded in the at least one spring or elastic device. The at least one spring or elastic device is attached to a support structure, which is attached to the sensing substrate 104. The movable element, support structure, and at least one electrode are fabricated in the same semiconductor layers as the drive/sense circuitry. In some embodiments, the at least one spring or elastic device and the support structure form a network of supports. The movable element, suspended by the network of supports, is free to move in any direction. The MEMS capacitively senses or produces movement of the movable element in any direction. In some embodiments, the direction can include a direction along at least one of the x-, y-, and z-directions. In some embodiments, a pitch between adjacent movable parts is in a range of 1 µm to 10 µm and a width of the movable element surrounded by the adjacent bonding regions is in a range of 100 to 10000 µm. In some embodiment, a thickness of the bonding region is in a range of 1 µm to 800 µm, depending on the thickness of the wafer. The size of the pitch between adjacent movable parts determines the sensitivity of the devices. Thus, the size of the pitch is determined based on different device applications.

In some embodiments, the patterning and etching techniques used to form the sensing substrate 104 may vary depending on the type of the MEMS device. For example, the patterning and etching for a MEMS accelerometer is different from the patterning and etching used for a MEMS gyroscope. Existing etching techniques like anisotropic etching, RIE, or the like may be used. In some embodiments, the thickness of the sensing substrate 104 can vary as a function of position along the length of the sensing substrate 104, where the length is defined along a direction orthogonal to the thickness of the sensing substrate 104. For example, the sensing substrate 104 may have a first thickness at one end, a second thickness in the center, and a third thickness at the other end.

Figure 8:
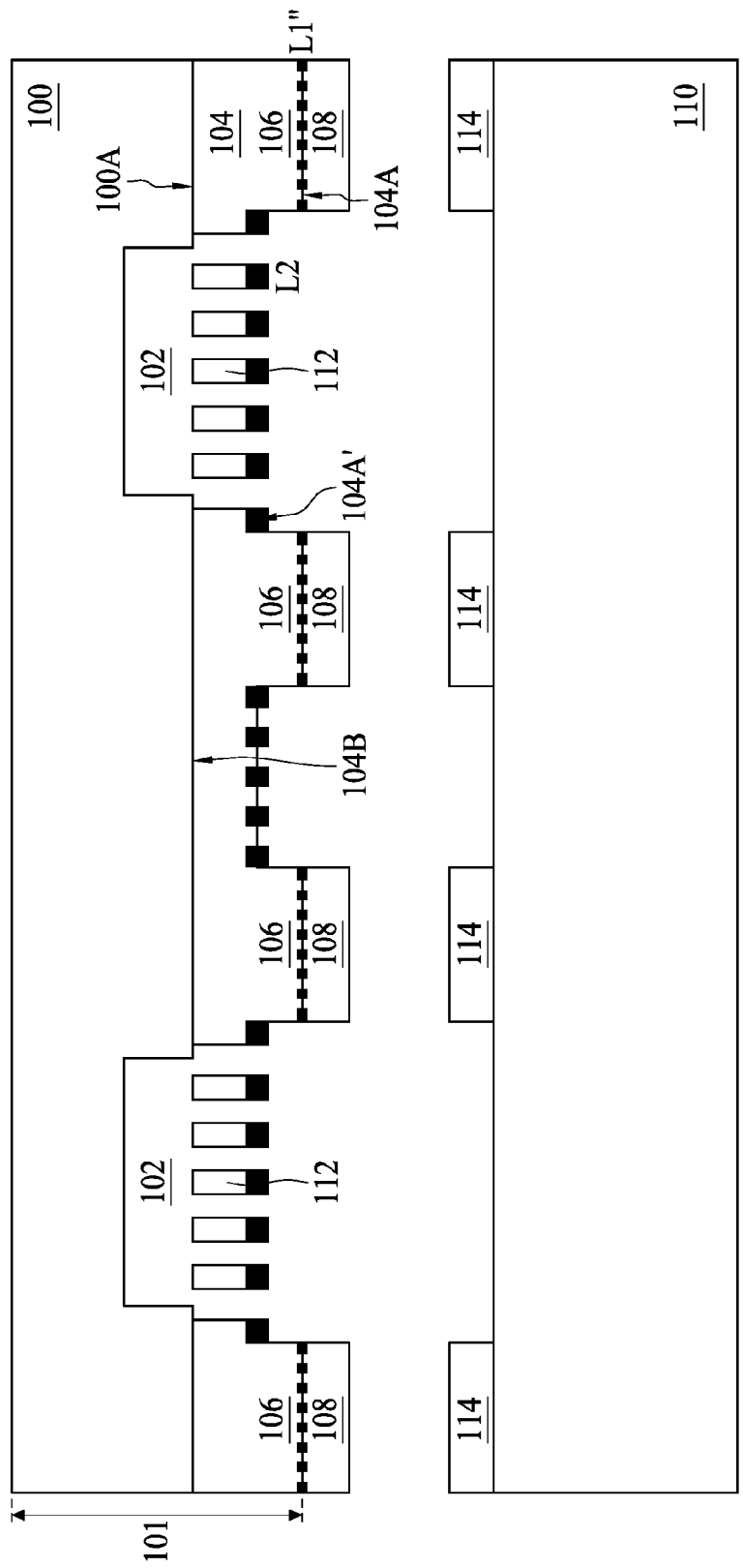
Figure 9:
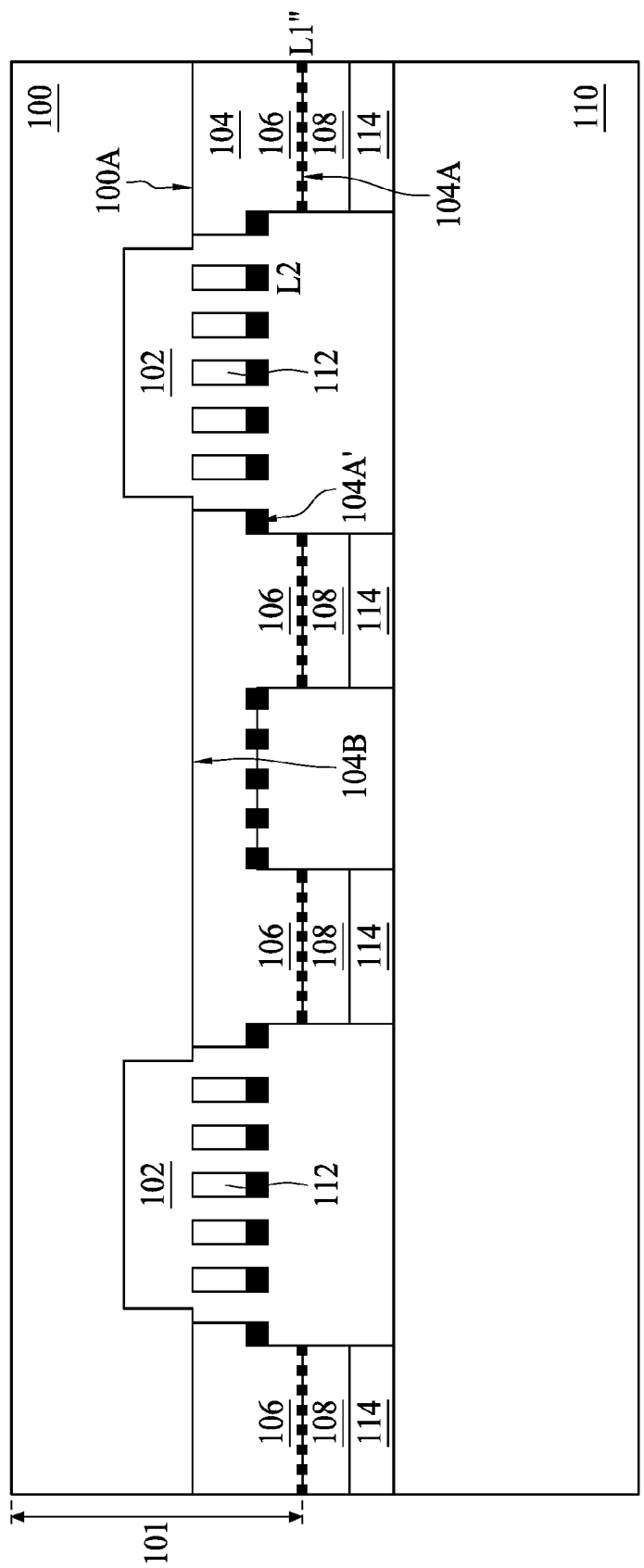

Next, as illustrated in FIG. 8, the ESOI substrate 101 and a CMOS substrate 110 are pre-cleaned and then aligned prior to eutectic bonding. In the present disclosure, a CMOS substrate can be termed as a CMOS wafer. The CMOS substrate 110 may include semiconductor materials such as silicon, although other semiconductor materials may be used. Thereafter, the ESOI substrate 101 is bonded to a CMOS substrate 110 as depicted in FIG. 9. In order to create the bond between the ESOI substrate 101 and the CMOS substrate 110, the bonding areas 114 of the CMOS substrate 110 is brought in contact with the bonding regions 106 of the ESOI substrate 101. The bonding interface is then subjected to pressure and heat in order to melt the conductive material at the bonding regions 106 and the corresponding bonding areas 114 of the CMOS substrate 110. Melting the conductive material results in a fusion bond that provides an ohmic contact between the ESOI substrate 101 and the CMOS substrate 110. The bond between the ESOI substrate 101 and the CMOS substrate 110 can be an Al/Ge eutectic bond. Please note that this is not a limitation of the present disclosure. In some embodiments, the eutectic bond may be comprised of other type of metallic materials.

The present disclosure provides a method for producing a CMOS-MEMS structure having the sensing substrate and the plurality of bonding regions composed of undoped semiconductor materials. And, the roughness of the first surface of the sensing substrate can be controlled in a range of 10 Å to 1000 Å after the etching operation, directly after the grinding operation.

In the present disclosure, sensing substrate and the plurality of bonding regions are made of the same semiconductor materials, and the bonding interface between the boding regions and the eutectic metal does not possess any polysilicon layer. In this connection, no Chemical Mechanical Planarization (CMP) operation is performed for generating a nearly mirror-surface with a surface roughness around 1-2 Å after the thinning of the sensing substrate. The more mirror-like surface, the more stiction would occur at lower g-force test. Alternatively stated, in order to prevent the stiction from taking place prematurely, the nearly mirror-like surface of the sensing substrate would need to be further roughened. Conventionally, the CMP operation is followed by a standoff operation which forms the bonding regions with several thousands of Angstrom protrusions on the sensing substrate. A depositing operation of an undoped semiconductor materials and an annealing operation for dopant diffusion are adopted to roughen the nearly mirror-like surface from a roughness of around 1-2 Å to around several hundreds of Angstroms. In contrast, in the present embodiments, no additional depositing and annealing operations are required to create a roughened surface thus yielding a simplified, low cost solution to form anti-stiction features in a MEMS device.

Some embodiments of the present disclosure provide a CMOS-MEMS structure. The CMOS-MEMS structure includes: a cap substrate with a cavity; a sensing substrate with a plurality of bonding regions, the sensing substrate and the plurality of bonding regions being composed of undoped semiconductor material; an eutectic metal layer over the plurality of bonding regions; and a CMOS substrate connecting to the sensing substrate through the eutectic metal layer; wherein the cap substrate is fusion-bonded to the sensing substrate, and the undoped semiconductor material is physically connected to the eutectic metal layer.

In some embodiments of the present disclosure, the sensing substrate and the plurality of bonding regions are made of undoped polysilicon.

In some embodiments of the present disclosure, a thickness of the eutectic metal layer defines bonding gaps between the CMOS substrate and the sensing substrate.

In some embodiments of the present disclosure, the eutectic metal layer 108 includes Ge, Al or copper.

In some embodiments of the present disclosure, the sensing substrate includes a movable element etched from a first surface of the sensing substrate, opposing to a second surface fusion-bonded to the cap substrate.

In some embodiments of the present disclosure, the roughness of the first surface of the sensing substrate is in a range of 10 Å to 1000 Å.

In some embodiments of the present disclosure, a pitch between adjacent movable elements is in a range of 1 µm to 10 µm and a width of the movable element surrounded by the adjacent bonding regions is in a range of 100 to 10000 µm.

In some embodiments of the present disclosure, a thickness of the bonding region is in a range of 1 µm to 800 µm.

Some embodiments of the present disclosure provide a method for manufacturing a CMOS-MEMS structure. The method includes: etching a cavity on a first surface of a cap substrate; bonding the first surface of the cap substrate with a sensing substrate; thinning a second surface of the sensing substrate, the second surface being opposite to a third surface of the sensing substrate bonded to the cap substrate; etching the second surface of the sensing substrate; patterning a portion of the second surface of the sensing substrate to form a plurality of bonding regions; depositing an eutectic metal layer on the plurality of bonding regions; etching a portion of the sensing substrate under the cavity to form a movable element; and bonding the sensing substrate to a CMOS substrate through the eutectic metal layer, wherein the sensing substrate and the plurality of bonding regions are composed of undoped semiconductor material In some embodiments of the present disclosure, etching the second surface of the sensing substrate includes a wet etching operation, a dry etching operation, a polishing operation, or combinations thereof.

In some embodiments of the present disclosure, further includes performing a Chemical Mechanical Planarization (CMP) on the plurality of bonding regions after patterning the portion of the second surface of the sensing substrate to form the plurality of bonding regions.

In some embodiments of the present disclosure, thinning the second surface of the sensing substrate includes performing a grinding operation.

In some embodiments of the present disclosure, the eutectic metal layer 108 includes Ge, Al or copper.

In some embodiments of the present disclosure, a roughness of the sensing substrate is in a range of 10 Å to 1000 Å after etching the second surface of the sensing substrate.

In some embodiments of the present disclosure, the movable element is etched to move in at least one of the x-, y-, and z-directions.

In some embodiments of the present disclosure, a pitch between adjacent movable elements is in a range of 1 µm to 10 µm and a width of the movable element surrounded by the adjacent bonding regions is in a range of 100 to 10000 µm.

Some embodiments of the present disclosure a method for controlling a surface roughness of a CMOS-MEMS structure. The method includes: etching a cavity on a first surface of a cap substrate; fusing bonding the cap substrate and a sensing substrate; thinning a second surface of the sensing substrate opposite to a third surface of the sensing substrate bonded to the cap substrate; and etching the second surface of the sensing substrate to achieve a surface roughness in a range of 10 Å to 1000 Å.

In some embodiments of the present disclosure, etching the second surface of the sensing substrate includes a wet etching operation, a dry etching operation, a polishing operation, or combinations thereof.

In some embodiments of the present disclosure, further includes patterning a portion of the second surface of the sensing substrate to form a plurality of bonding regions and subsequently performing a Chemical Mechanical Planarization (CMP) on the plurality of bonding regions.

In some embodiments of the present disclosure, thinning the second surface of the sensing substrate includes performing a grinding operation.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a CMOS-MEMS structure, comprising:
    etching a cavity on a first surface of a cap substrate;
    bonding the first surface of the cap substrate with a sensing substrate;
    thinning a second surface of the sensing substrate, the second surface being opposite to a third surface of the sensing substrate bonded to the cap substrate;
    etching the second surface of the sensing substrate while maintaining a planar profile of the etched second surface with a first roughness;
    patterning a portion of the second surface of the sensing substrate to form a plurality of bonding regions and a plurality of recess bottoms, the plurality of recess bottoms having a second roughness, wherein the first roughness is controlled to be smaller than the second roughness;
    depositing an eutectic metal layer on the plurality of bonding regions;
    etching a portion of the sensing substrate under the cavity to form a movable element; and
    bonding the sensing substrate to a CMOS substrate through the eutectic metal layer,
    wherein the sensing substrate and the plurality of bonding regions are composed of undoped semiconductor material.

2. The method of claim 1, wherein etching the second surface of the sensing substrate comprises a wet etching operation, a dry etching operation, a polishing operation, or combinations thereof.

3. The method of claim 1, further comprising performing a Chemical Mechanical Planarization (CMP) on the plurality of bonding regions after patterning the portion of the second surface of the sensing substrate to form the plurality of bonding regions.

4. The method of claim 1, wherein thinning the second surface of the sensing substrate comprises performing a grinding operation.

5. The method of claim 1, wherein the eutectic metal layer comprises Ge, Al or copper.

6. The method of claim 1, wherein a roughness of the sensing substrate is in a range of 10 Å to 1000 Å after etching the second surface of the sensing substrate.

7. The method of claim 1, wherein the movable element is etched to move in at least one of the x-, y-, and z-directions.

8. The method of claim 1, further comprising an additional movable element adjacent to the movable element, wherein a pitch between adjacent movable elements is in a range of 1 μm to 10 μm and a width of the movable element surrounded by the adjacent bonding regions is in a range of 100 to 10000 μm.

9. A method for controlling a surface roughness of a CMOS-MEMS structure, comprising:
- etching a cavity on a first surface of a cap substrate;
- bonding the cap substrate and a sensing substrate;
- thinning a second surface of the sensing substrate opposite to a third surface of the sensing substrate bonded to the cap substrate;
- etching the second surface of the sensing substrate to maintain a planar profile with a first roughness in a range of from 10 Å to 1000 Å; and
- patterning a portion of the second surface of the sensing substrate to form a plurality of recess bottoms, each having a second roughness,
- wherein the first roughness is controlled to be smaller than the second roughness.

10. The method of claim 9, wherein etching the second surface of the sensing substrate comprises a wet etching operation, a dry etching operation, a polishing operation, or combinations thereof.

11. The method of claim 9, further comprising patterning a portion of the second surface of the sensing substrate to form a plurality of bonding regions and subsequently performing a Chemical Mechanical Planarization (CMP) on the plurality of bonding regions.

12. The method of claim 9, wherein thinning the second surface of the sensing substrate comprises performing a grinding operation.

13. The method of claim 9, wherein etching the second surface of the sensing substrate comprises a wet-etchant comprising a base and an oxidant.

14. The method of claim 13, wherein the base comprises ammonium hydroxide ($NH_4OH$), tetramethylammonium hydroxide (TMAH), and potassium hydroxide (KOH).

15. The method of claim 13, wherein the oxidant comprises hydrogen peroxide ($H_2O_2$) and ozone ($O_3$).

16. A method for controlling a surface roughness of a CMOS-MEMS structure, comprising:
- etching a cavity on a first surface of a cap substrate;
- bonding the cap substrate and a sensing substrate;
- thinning the sensing substrate from a second surface opposite to a third surface bonded to the cap substrate;
- etching the second surface right after the thinning the sensing substrate to achieve a first roughness; and
- patterning a portion of the second surface of the sensing substrate to form a plurality of bonding regions and a plurality of recess bottoms, the plurality of recess bottoms having a second roughness,
- wherein the first roughness is controlled to be smaller than the second roughness.

17. The method of claim 16, further comprising performing a chemical mechanical planarization operation over the plurality of the bonding regions.

18. The method of claim 16, wherein the first roughness is controlled to be in a range of from about 10 Å to 1000 Å.

19. The method of claim 16, wherein the etching the second surface comprises performing a wet etching operation comprising a base and an oxidant.

20. The method of claim 16, further comprising:
- depositing an eutectic metal layer over the plurality of bonding regions; and
- patterning the plurality of recess bottoms to form movable elements.

* * * * *